US012618908B2

(12) United States Patent
Kyo

(10) Patent No.: US 12,618,908 B2
(45) Date of Patent: May 5, 2026

(54) VEHICLE POWER SUPPLY SYSTEM

(71) Applicant: TOYOTA JIDOSHA KABUSHIKI KAISHA, Toyota (JP)

(72) Inventor: Masaaki Kyo, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 382 days.

(21) Appl. No.: 18/463,592

(22) Filed: Sep. 8, 2023

(65) Prior Publication Data

US 2024/0159832 A1      May 16, 2024

(30) Foreign Application Priority Data

Nov. 16, 2022     (JP) .................................. 2022-183300

(51) Int. Cl.
*G01R 31/367*          (2019.01)
*G01R 31/392*          (2019.01)

(52) U.S. Cl.
CPC ......... *G01R 31/367* (2019.01); *G01R 31/392* (2019.01)

(58) Field of Classification Search
CPC ............................ G01R 41/367; G01R 41/392
See application file for complete search history.

(56) References Cited

U.S. PATENT DOCUMENTS

2005/0001625 A1 *   1/2005   Ashtiani .............. G01R 31/392
                                                        324/426
2010/0264929 A1 *   10/2010   Ugaji ................... G01R 31/392
                                                        324/426
2011/0060538 A1 *   3/2011   Fahimi ................. G01R 31/392
                                                        702/63
2012/0253537 A1 *   10/2012   Okuda ..................... H02J 3/32
                                                        700/296
2019/0120909 A1 *   4/2019   Koizumi ................. H02J 7/977
2019/0293720 A1 *   9/2019   Fujita ................... H01M 10/48
2022/0058892 A1 *   2/2022   Haga .................... G07C 5/0808
2022/0094190 A1 *   3/2022   McCord ................. B60L 58/20
                            (Continued)

FOREIGN PATENT DOCUMENTS

JP          H11-086912 A          3/1999
JP          2018-146372 A          9/2018
                            (Continued)

OTHER PUBLICATIONS

Deng et al. "Battery health estimation with degradation pattern recognition and transfer learning" (2022) (https://www.sciencedirect.com/science/article/abs/pii/S0378775322000519) (Year: 2022).*

*Primary Examiner* — Sujay Koneru

(74) *Attorney, Agent, or Firm* — SoraIP, Inc.

(57)          ABSTRACT

A vehicle power supply system including a battery that supplies electric power to an in-vehicle load, comprising: an acquisition unit that acquires information on discharging of a battery; a derivation unit that derives a current life discharge amount of the battery based on information on discharging of the battery acquired by the acquisition unit and a correlation between a discharge depth of the battery and a life discharge amount; and an calculation unit that calculates data related to determination of a softening deterioration state of the battery based on the current life discharge amount of the battery derived by the derivation unit and information on discharging of the battery acquired by the acquisition unit.

3 Claims, 4 Drawing Sheets

(56)  References Cited

U.S. PATENT DOCUMENTS

| | | | |
|---|---|---|---|
| 2023/0006282 A1* | 1/2023 | Naoi ................... | H01M 10/441 |
| 2023/0096267 A1* | 3/2023 | Kawahara ........... | G01R 31/396 |
| | | | 702/63 |
| 2023/0356677 A1* | 11/2023 | Przybylski ............. | B60R 16/03 |
| 2024/0377463 A1* | 11/2024 | Nakamura ............... | H02J 7/00 |

FOREIGN PATENT DOCUMENTS

| | | | | |
|---|---|---|---|---|
| JP | 2019-078572 A | | 5/2019 | |
| KR | 20160090226 A | * | 7/2016 | .......... G01R 31/392 |

* cited by examiner

FIG. 2

| DEPTH OF DISCHARGE [%] | NUMBER OF OCCURRENCES |
|---|---|
| 0~1 | 0 |
| 1~2 | 1 |
| 2~3 | 7 |
| 3~4 | 25 |
| 4~5 | 45 |
| 5~6 | 15 |
| 6~7 | 5 |
| 7~8 | 1 |
| 8~9 | 1 |
| 9~10 | 0 |

VEHICLE POWER SUPPLY SYSTEM

CROSS-REFERENCE TO RELATED APPLICATION

This application claims priority to Japanese Patent Application No. 2022-183300 filed on Nov. 16, 2022, incorporated herein by reference in its entirety.

BACKGROUND

1. Technical Field

The present disclosure relates to a power supply system mounted on a vehicle.

2. Description of Related Art

Japanese Unexamined Patent Application Publication No. 2019-078572 (JP 2019-078572 A) discloses a power supply system capable of accurately determining softening deterioration of a lead battery used for supplying electric power to an electric load of a vehicle. In the power supply system, the charge amount, the discharge amount, and the depth of discharge of the lead battery are each acquired, and the softening deterioration of the lead battery is determined based on the charge amount, the discharge amount, and the depth of discharge of the lead battery that are acquired.

SUMMARY

A lifetime discharge amount of a battery that serves as a reference for determining softening deterioration of the battery is estimated by, for example, a single-piece test of the battery. However, the discharge pattern used in the single-piece test of the battery is generally a pattern in which the depth of discharge is constant. Therefore, there is an issue that the lifetime discharge amount estimated by the single-piece test of the battery deviates from a lifetime discharge amount based on the depth of discharge of various patterns actually occurred in the vehicle used in the market.

Therefore, there is room for further study on a method for accurately determining the softening deterioration of the battery.

The present disclosure has been made in view of the above issue, and an object of the present disclosure is to provide a vehicle power supply system capable of improving accuracy of data related to determination of a softening deterioration state of a battery.

In order to solve the above issue, an aspect of the present disclosure includes a vehicle power supply system including a battery that supplies electric power to an in-board load. The vehicle power supply system includes: an acquisition unit that acquires information on discharging of the battery; a derivation unit that derives a current lifetime discharge amount of the battery based on the information on the discharging of the battery acquired by the acquisition unit and a correlation between a depth of discharge and a lifetime discharge amount of the battery; and a calculation unit that calculates data related to determination of a softening deterioration state of the battery, based on the current lifetime discharge amount of the battery derived by the derivation unit and the information on the discharging of the battery acquired by the acquisition unit.

In the vehicle power supply system according to the present disclosure, the data related to the determination of the softening deterioration state of the battery is calculated based on the correlation between the information on the discharging of the battery, and the depth of discharge and the lifetime discharge amount of the battery. As a result, it is possible to improve the accuracy of the data related to the determination of the softening deterioration state of the battery.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 2 is a table diagram showing the correspondence between the actual discharge depth and the number of occurrences of the battery;

DETAILED DESCRIPTION OF EMBODIMENTS

The vehicle power supply system of the present disclosure derives a life discharge amount of a battery at present based on a history of a discharge depth generated in a current battery and a correlation between a discharge depth of the battery and a life discharge amount obtained in advance by simulation or the like. Then, the softening degradation rate of the battery is calculated from the derived current life discharge amount of the battery and the previous accumulated discharge amount of the battery. Accordingly, it is possible to improve the accuracy of determining the softening deterioration state of the battery. Hereinafter, an embodiment of the present disclosure will be described in detail with reference to the drawings.

Embodiment

Configuration

Figure 1:
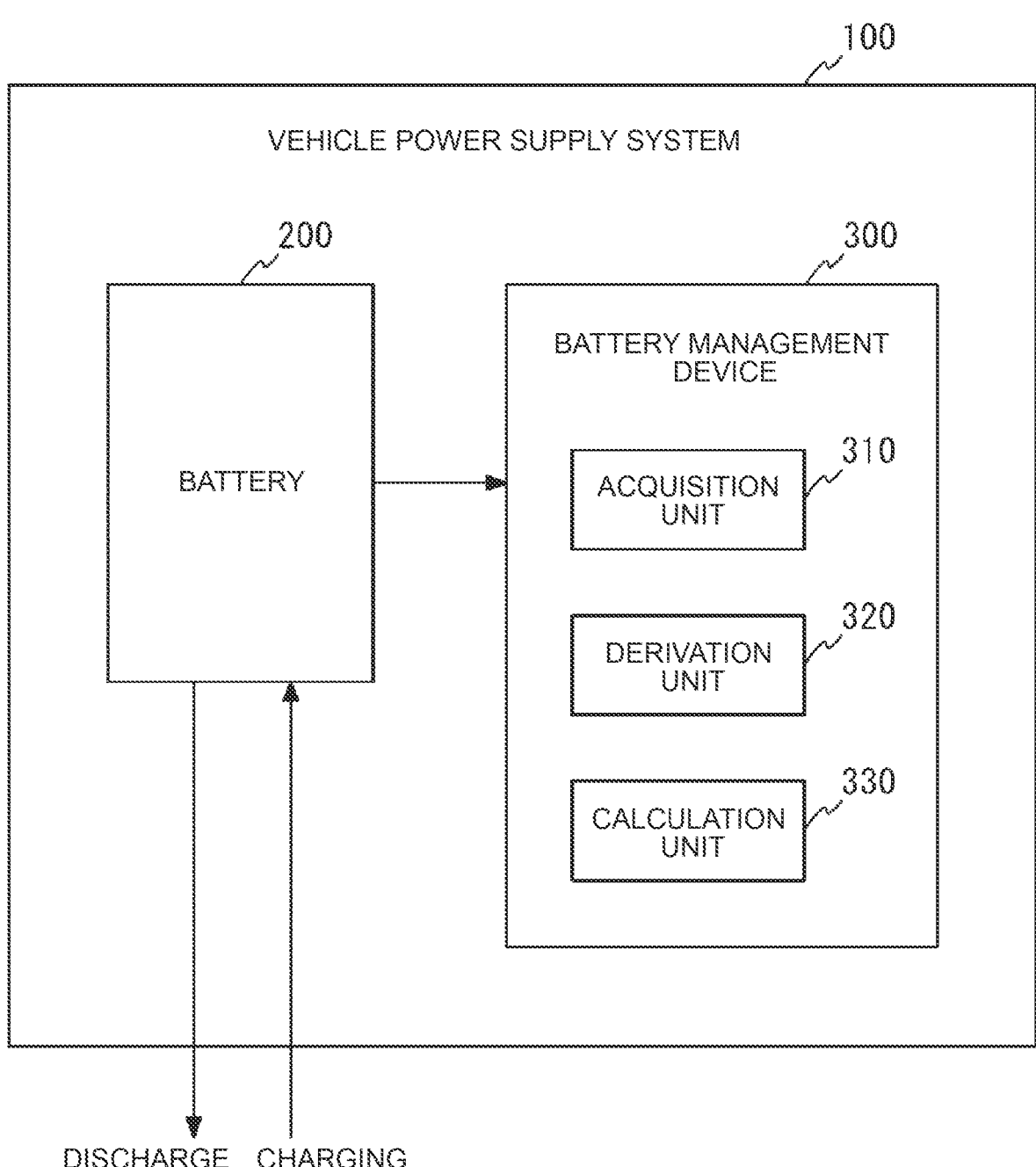
FIG. 1 is a schematic configuration diagram of a vehicle power supply system according to an embodiment of the present disclosure.

FIG. 1 is a schematic diagram for explaining a configuration example of a vehicle power supply system 100 according to an embodiment of the present disclosure. The vehicle power supply system 100 illustrated in FIG. 1 includes a battery 200 and a battery management device 300. The vehicle power supply system 100 is mounted on a vehicle, for example.

The battery 200 is a secondary battery configured to be chargeable and dischargeable, such as a lead-acid battery or a lithium-ion battery. The battery 200 can supply (discharge) power necessary for an auxiliary on-board load (not shown) other than for driving the vehicle, and can receive (charge) power from a main on-board load (not shown) for driving the vehicle. As the battery 200, a so-called auxiliary battery can be exemplified.

The battery management device 300 is a device capable of performing management of the battery 200 including a process of determining a softening degradation state of the battery 200. The battery management device 300 includes an acquisition unit 310, a derivation unit 320, and a calculation unit 330.

The acquisition unit 310 is a configuration for acquiring information related to discharging of the battery 200. The information regarding the discharge of the battery 200 includes at least the "accumulated discharge amount" which is the amount of electric power of the discharge (supply) performed by the battery 200 to the auxiliary equipment or the like so far. The information regarding the discharge of the battery 200 includes at least "actual discharge depth", which is a Depth Of Discharge (DOD) actually generated in the battery 200 in the discharge performed by the battery 200 with respect to an auxiliary device or the like. The information regarding the discharge of the battery 200 includes at least the "number of occurrences (or occurrence frequency)" of each of the actual discharge depths.

FIG. 2 is a diagram illustrating an example of an image in which information on the actual discharge depth and the number of occurrences of the battery 200 acquired by the acquisition unit 310 is represented by a correspondence table. In the example of FIG. 2, the actual discharge depths generated in the battery 200 are divided into a plurality according to the magnitudes thereof, and the number of times (or frequency) of occurrence of the discharge depths is recorded for each of the divisions.

Note that the information on the current and the temperature of the battery 200 may be included in the information on the discharge of the battery 200. The acquisition unit 310 can acquire the information related to the discharge of the battery 200 described above via various sensors (not shown) or the like capable of detecting the physical quantity of the battery 200.

The derivation unit 320 is configured to derive the current life discharge amount of the battery 200 based on the information on the discharge of the battery 200 acquired by the acquisition unit 310 and the correlation between the discharge depth of the battery 200 and the life discharge amount. Specifically, the derivation unit 320 identifies the actual discharge depth of the battery 200 satisfying the predetermined condition from the information regarding the discharge of the battery 200, and derives the life discharge amount correlated with the identified actual discharge depth as the current life discharge amount of the battery 200.

Examples of the predetermined condition include a discharge depth in which the number of occurrences (or occurrence frequency) is equal to or greater than a predetermined value, and a maximum discharge depth in the discharge depth. For example, when the total number of occurrences shown in FIG. 2 is 100, the discharge depth "6 to 7%" which is the maximum in the actual discharge depths of 2 to 3%, 3 to 4%, 4 to 5%, 5 to 6%, and 6 to 7% corresponding to the condition is specified by the derivation unit 320 on condition that the number of occurrences is 2 or more (or the occurrence frequency is 2% or more) as a predetermined value.

Figure 3:
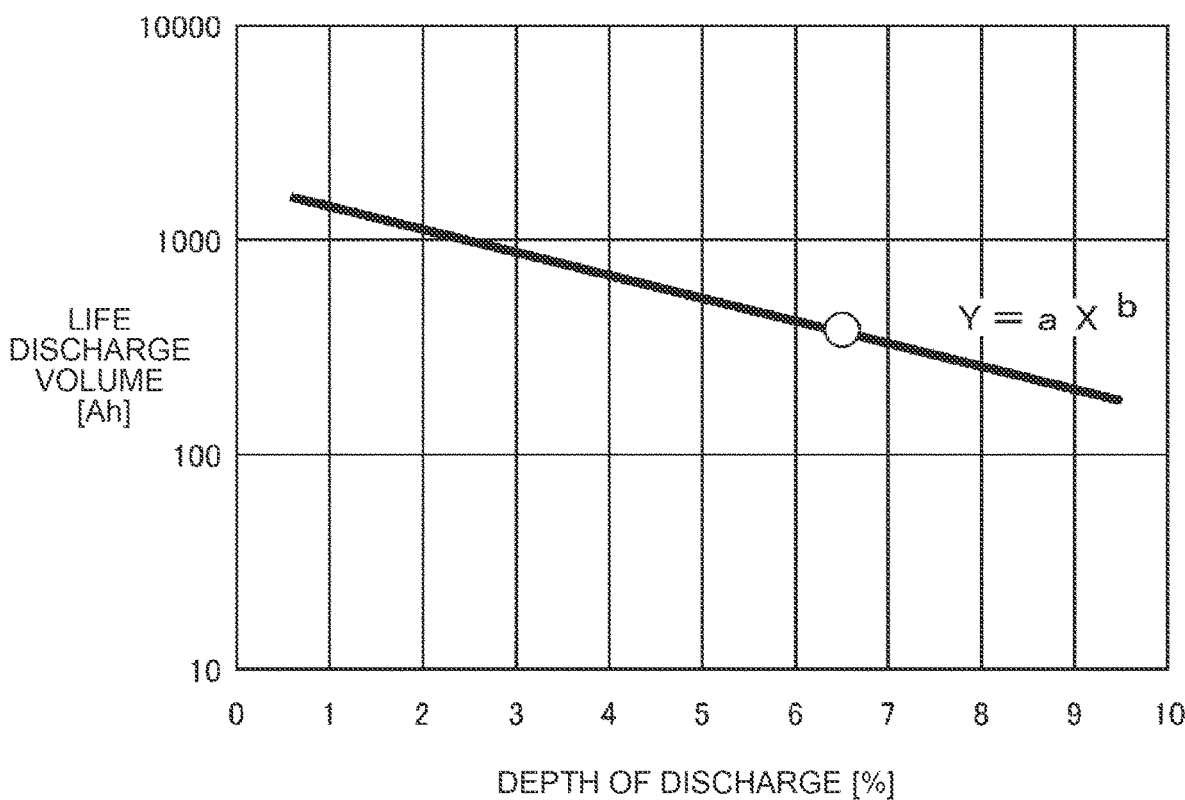
FIG. 3 is a graph showing the correlation between the discharge depth of the battery and the lifetime discharge amount.

Next, the derivation unit 320 applies the specified actual discharge depth to the correlation between the discharge depth (stress) of the battery 200 and the lifetime discharge amount (stress). FIG. 3 is a semi-logarithmic diagram illustrating an example of the correlation between the discharge depth of the battery 200 and the lifetime discharge amount. Such a correlation is created in advance by a single-piece test of the battery 200, and is determined by a relational expression ($Y=a \times X^{\hat{}} b$) in which a value obtained by multiplying the discharge depth X by the exponentiation of the coefficient b by the coefficient a is set as the life discharge amount Y as an example. The coefficient a and the coefficient b are appropriately determined based on the capacity and characteristics of the battery 200, performance required for the vehicle, and the like.

For example, when the actual discharge depth "6 to 7%" which can be specified from FIG. 2 is applied to the correlations shown in FIG. 3, approximately a 300 Ah to 500

Ah (a white circle in FIG. 3) can be derived as the life discharge quantity of the battery 200 in the state of being used from the new state (at the time of replacement) to the present state.

The calculation unit 330 is configured to calculate data related to the determination of the softening deterioration state of the battery 200 based on the current life discharge amount of the battery 200 derived by the derivation unit 320 and the information related to the discharge acquired by the acquisition unit 310. The data related to the determination of the softening deterioration state of the battery 200 can be exemplified by a "softening deterioration rate" indicating a rate at which deterioration due to softening of the active material of the battery 200 is progressing. Specifically, the calculation unit 330 calculates the softening degradation rate of the battery 200 based on the ratio of the accumulated discharge amount of the battery 200 to the current life discharge amount of the battery 200 by using the accumulated discharge amount of the battery 200 from the information on the discharge of the battery 200 (softening degradation rate=accumulated discharge amount/current life discharge amount).

For example, when the current life discharge amount of the battery 200 derived from the correlation by the derivation unit 320 is 500 Ah and the accumulated discharge amount of the battery 200 obtained by the acquisition unit 310 is 250 Ah, the softening degradation rate of the battery 200 is calculated as "0.5 (=250/500)".

Note that a part of the above-described vehicle power supply system 100 (battery management device 300) may typically be configured as a processor such as a microcomputer, a memory, an Electronic Control Unit (ECU) including an input/output interface, and the like. The electronic control unit can realize some or all of the functions of the acquisition unit 310, the derivation unit 320, and the calculation unit 330 by the processor reading and executing the program stored in the memory.

Control

Figure 4:
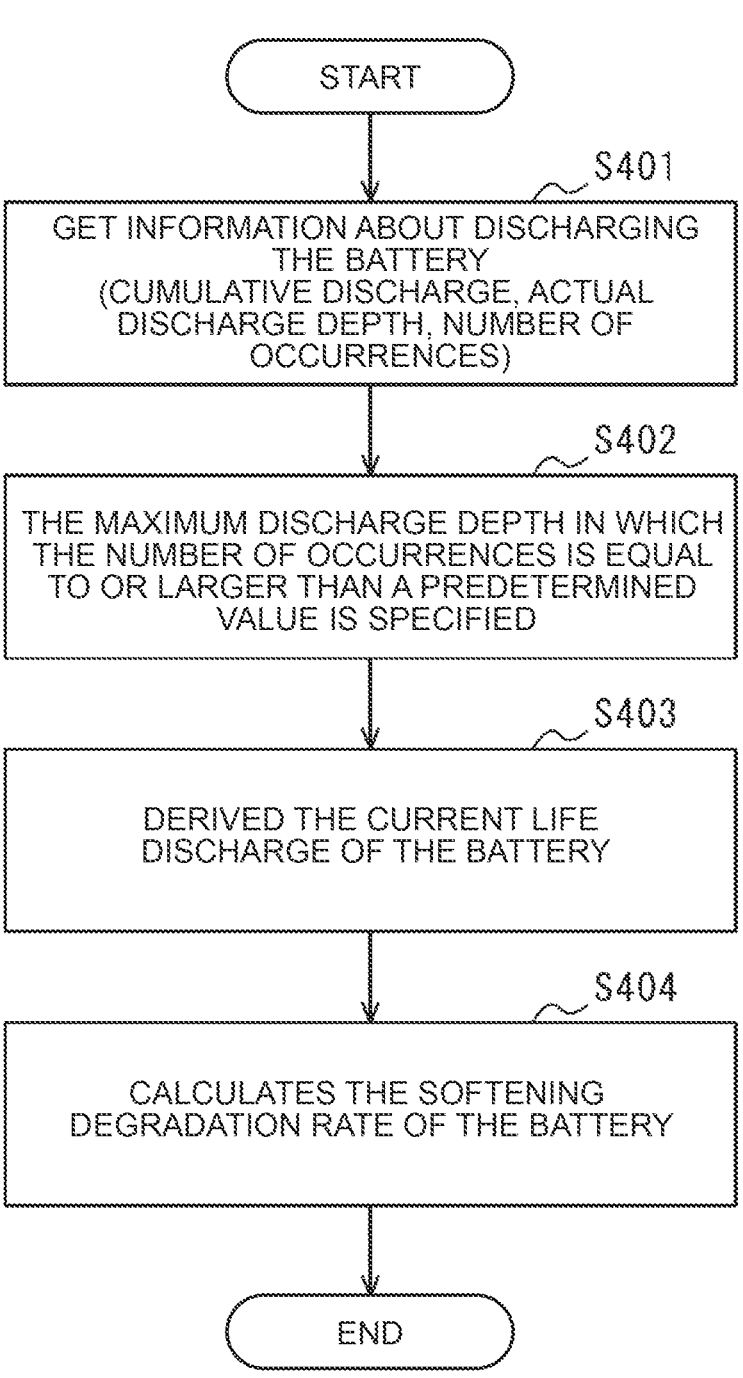
FIG. 4 is a processing flowchart of a softening degradation rate calculation of a battery executed by the vehicle power supply system.

Next, the control executed by the vehicle power supply system 100 according to the present embodiment will be described with reference to FIG. 4. FIG. 4 is a flowchart for explaining a processing procedure of the softening degradation rate calculation of the battery 200 executed by the vehicle power supply system 100 (the battery management device 300 of the vehicle). The softening degradation rate calculation process of the battery 200 illustrated in FIG. 4 is executed, for example, every time the ignition switch of the vehicle is turned IG-ON.

S401

The acquisition unit 310 of the vehicle power supply system 100 acquires information related to discharging of the battery 200. The information related to the discharge of the battery 200 acquired by the acquisition unit 310 includes at least the accumulated discharge amount of the battery 200, a plurality of actual discharge depths, and the number of occurrences (or the occurrence frequency) of each actual discharge depth. When the acquisition unit 310 acquires information regarding discharging of the battery 200, the process proceeds to S402.

S402

The derivation unit 320 of the vehicle power supply system 100 specifies a discharge depth at which the number of occurrences (or the occurrence frequency) thereof is equal to or greater than a predetermined value among a plurality of actual discharge depths and at which the discharge depth becomes the maximum, based on the information on the discharge of the battery 200 acquired by the acquisition unit

5

310. When the derivation unit 320 specifies the largest discharging depth at which the number of occurrences (or the occurrence frequency) is equal to or greater than a predetermined value, the process proceeds to S403.

S403

The derivation unit 320 of the vehicle power supply system 100 derives the current life discharge amount of the battery 200, which is the life discharge amount of the battery 200 in the current use state, based on the relation between the discharge depth and the life discharge amount of the battery 200 and the largest discharge depth at which the number of occurrences (or the occurrence frequency) specified in S402 is equal to or greater than a predetermined value. When the current life discharging quantity of the battery 200 is derived by the derivation unit 320, the process proceeds to S404.

S404

The calculation unit 330 of the vehicle power supply system 100 calculates the softening degradation rate of the battery 200 based on the current life discharge amount of the battery 200 derived by the derivation unit 320 and the cumulative discharge amount of the battery 200 acquired by the acquisition unit 310 as information related to the discharge of the battery 200. When the calculation unit 330 calculates the softening degradation rate of the battery 200, the processing of the softening degradation rate calculation of the battery 200 ends.

The softening degradation rate of the battery 200 calculated by the above processing is used to determine the softening degradation state of the battery 200.

Operations and Effects

As described above, according to the vehicle power supply system 100 according to the embodiment of the present disclosure, the current life discharge amount of the battery 200 is derived based on the information on the discharge of the battery 200 (the actual discharge depth of the battery 200 and the number of occurrences of the actual discharge depth) and the correlation between the discharge depth of the battery 200 and the life discharge amount, and the softening degradation rate of the battery 200 is calculated based on the derived current life discharge amount of the battery 200 and the information on the discharge (the accumulated discharge amount of the battery 200).

By this processing, it is possible to improve the accuracy of the softening degradation rate of the battery 200, which is one of the data related to the determination of the softening degradation state of the battery 200.

Although an embodiment of the present disclosure has been described above, the present disclosure can be regarded as a vehicle power supply system, a control method executed by a vehicle power supply system including a processor and a memory, a control program for executing the control method, a computer-readable non-transitory storage medium storing a control program, a vehicle equipped with a vehicle power supply system, and the like.

The vehicle power supply system of the present disclosure can be used, for example, in a case where it is desired to improve the accuracy of data related to determination of a softening deterioration state of a battery mounted in a vehicle.

What is claimed is:

1. A vehicle power supply system comprising:
a battery that supplies electric power to an in-board load of a vehicle; and
a processor configured to perform a process related to a softening deterioration state of the battery in response to an ignition switch of the vehicle being turned on, wherein the process includes
acquiring information on discharging of the battery that includes information on a plurality of actual depths of discharge performed by the battery,
deriving a current lifetime discharge amount of the battery by
specifying an actual depth of discharge that satisfies a predetermined condition from among the plurality of actual depths of discharge, and
applying the specified actual depth of discharge to a correlation between a depth of discharge and a lifetime discharge amount of the battery that is created in advance, and
calculating data related to determination of the softening deterioration state of the battery, based on the derived current lifetime discharge amount of the battery and the acquired information on the discharging of the battery, wherein
the information on the discharging of the battery includes an accumulated discharge amount of the battery, and the number of occurrences of each of the plurality of the actual depths of discharge,
the data related to determination of the softening deterioration state of the battery is a softening deterioration rate of the battery
the softening deterioration rate of the battery is calculated based on the accumulated discharge amount of the battery and the current lifetime discharge amount of the battery, and
the predetermined condition is that a depth of discharge is maximum among actual depths at which the battery has been discharged at least a predetermined number of times.

2. The vehicle power supply system according to claim 1, wherein the softening deterioration rate of the battery is a ratio of the accumulated discharge amount of the battery to the current lifetime discharge amount of the battery.

3. The vehicle power supply system according to claim 1, wherein the correlation is created based on at least one of the depth of discharge of the battery, a capacity and characteristics of the battery, or performance required for a vehicle on which the battery is mounted.

* * * * *